(12) United States Patent
Chang (10) Patent No.: US 10,775,428 B2
(45) Date of Patent: Sep. 15, 2020

(54) SYSTEM AND DEVICE FOR AUTOMATIC SIGNAL MEASUREMENT

(71) Applicant: DFI Inc., New Taipei (TW)

(72) Inventor: Chia-yi Chang, New Taipei (TW)

(73) Assignee: DFI Inc., New Taipei (TW)

(*) Notice: Subject to any disclaimer, the term of this patent is extended or adjusted under 35 U.S.C. 154(b) by 247 days.

(21) Appl. No.: 16/018,238

(22) Filed: Jun. 26, 2018

(65) Prior Publication Data
US 2019/0391202 A1    Dec. 26, 2019

(51) Int. Cl.
*G01R 31/28* (2006.01)
*G06F 11/30* (2006.01)
*G01R 1/073* (2006.01)

(52) U.S. Cl.
CPC ..... *G01R 31/2834* (2013.01); *G01R 1/07328* (2013.01); *G01R 31/2808* (2013.01); *G01R 31/2813* (2013.01); *G01R 31/2815* (2013.01); *G06F 11/3031* (2013.01)

(58) Field of Classification Search
CPC ............. G01R 31/26; G01R 31/2642; G01R 31/2648; G01R 31/2831; G01R 31/31702
See application file for complete search history.

(56) References Cited

U.S. PATENT DOCUMENTS

| | | | | |
|---|---|---|---|---|
| 5,950,181 | A * | 9/1999 | Federl | G01R 13/206 706/15 |
| 6,494,039 | B2 * | 12/2002 | Pratt | F15B 9/09 60/368 |
| 2008/0164891 | A1 * | 7/2008 | Kuo | G01R 1/07371 324/754.03 |
| 2012/0032684 | A1 * | 2/2012 | Siddiquie | G01R 31/70 324/538 |

* cited by examiner

*Primary Examiner* — Tung X Nguyen (57) ABSTRACT

The system for automatic signal measurement includes a device under test, a control circuit, a data processing circuit, and a display device. The device under test includes a test pad area, which has multiple exposed test pads coupled to multiple circuit nodes in the device under test. The control circuit is coupled to the exposed test pads through a clamping fixture. The control circuit receives multiple test signals from the exposed test pads, stores multiple test signals in the memory, and controls a power on/off operation applied to the device under test through the exposed test pads. The data processing circuit is configured to receive the test signals stored in the memory, and determine whether the test signals meet a set of predetermined criteria to generate a verification result. The display device displays a signal waveform of the test signals and the verification result.

20 Claims, 6 Drawing Sheets

SYSTEM AND DEVICE FOR AUTOMATIC SIGNAL MEASUREMENT

TECHNICAL FIELD

The disclosure relates in general to signal measurement, and more particularly to a system capable of verifying the measured signals automatically.

BACKGROUND

In general, the motherboard used by a computer needs to be verified by a power sequence in order to determine whether the motherboard can be used normally. The power sequence testing generally relates to whether the voltage level of a test signal on the motherboard is correct when the motherboard is powered on/off and whether the voltage transition time of each concerned test signal is correct. Conventionally a test engineer uses an oscilloscope to check whether there is abnormality in the test signals one by one. However, since the number of signals to be tested on the motherboard is large, measuring signals one by one will take a lot of time, resulting in a decrease in test efficiency. Moreover, the test engineer has to manually record the measured voltage and timing information to check whether a number of timing requirements are met, making the test process even more difficult.

SUMMARY OF THE INVENTION

The invention is related to a system and device for automatic signal measurement. By providing a device under test having a test pad area, the test process can be simplified. In addition, the proposed system is able to measure multiple signals and verify the measured signals automatically.

According to one embodiment of the invention, a system for automatic signal measurement is provided. The system includes a device under test, a control circuit, a data processing circuit, and a display device. The device under test includes a test pad area. The test pad area has multiple exposed test pads coupled to multiple circuit nodes in the device under test. The control circuit includes a memory. The control circuit is coupled to the exposed test pads through a clamping fixture. The control circuit is configured to receive multiple test signals from the exposed test pads, store multiple test signals in the memory, and control a power on/off operation applied to the device under test through the exposed test pads. The data processing circuit is coupled to the control circuit. The data processing circuit is configured to receive the test signals stored in the memory, and determine whether the test signals meet a set of predetermined criteria to generate a verification result. The display device is driven by the data processing circuit for displaying a signal waveform of the test signals and the verification result.

According to another embodiment of the invention, a device adaptable for automatic signal measurement is provided. The device includes a printed circuit board, a circuit under test disposed on the printed circuit board, and a test pad area on the printed circuit board. The test pad area has multiple exposed test pads coupled to multiple circuit nodes in the circuit under test. The exposed test pads are configured for conductive connection to an external circuit through a clamping fixture.

According to further embodiment of the invention, a system for automatic signal measurement of a device under test is provided. The device under test includes a test pad area having a number of exposed test pads coupled to a number of circuit nodes in the device under test. The system includes a control circuit, a data processing circuit, and a display device. The control circuit includes a memory. The control circuit is coupled to the exposed test pads through a clamping fixture. The control circuit is configured to receive a number of test signals from the exposed test pads, store the test signals in the memory, and control a power on/off operation applied to the device under test through the exposed test pads. The data processing circuit is coupled to the control circuit. The data processing circuit is configured to receive the test signals stored in the memory, and determine whether the test signals meet a set of predetermined criteria to generate a verification result. The display device is driven by the data processing circuit, for displaying a signal waveform of the test signals and the verification result.

The above and other aspects of the invention will become better understood with regard to the following detailed description of the preferred but non-limiting embodiment(s). The following description is made with reference to the accompanying drawings.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION OF THE INVENTION

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Figures 1, 2:
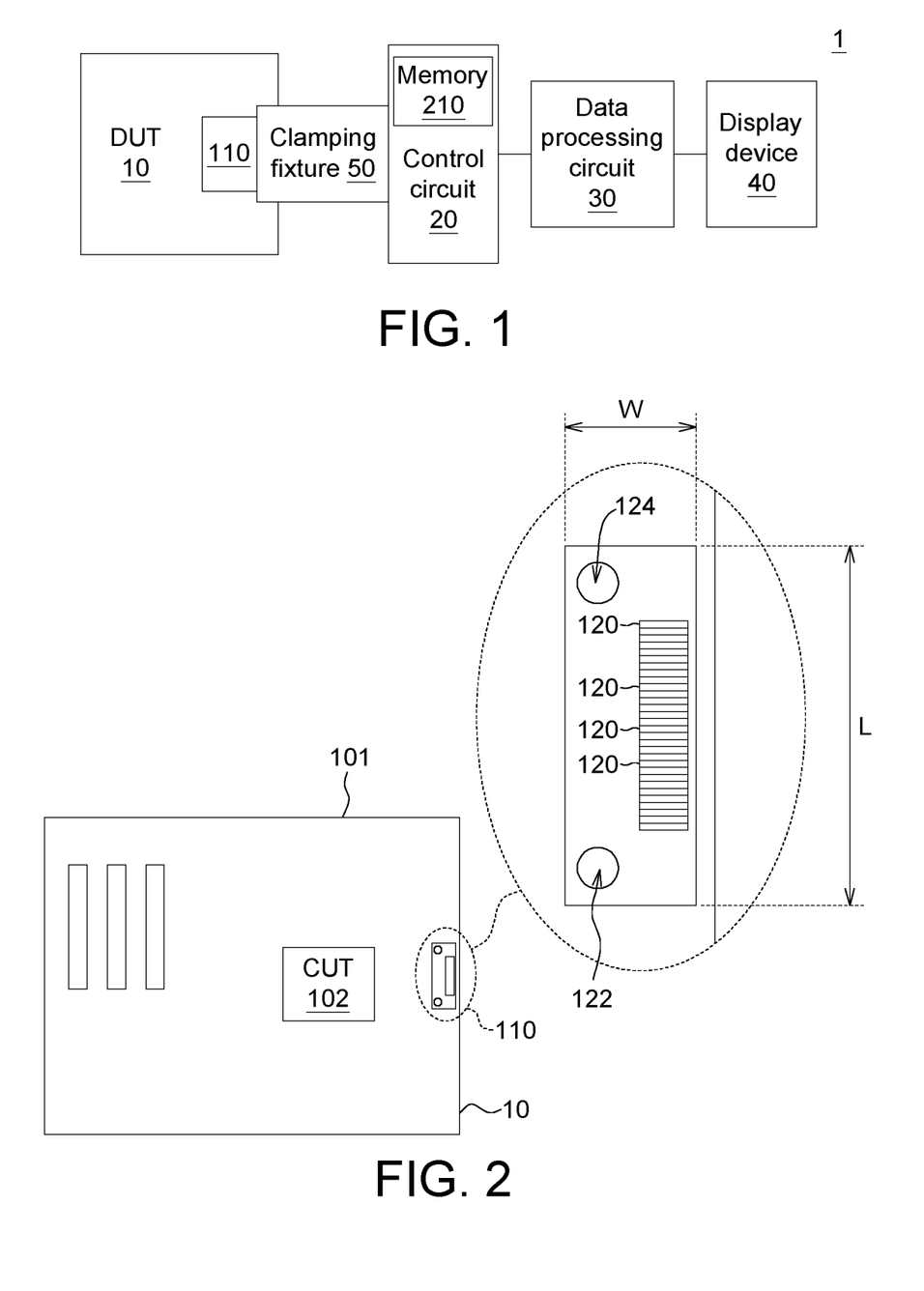
FIG. 1 shows a system for automatic signal measurement according to one embodiment of the disclosure.
FIG. 2 shows the test pad area in the device under test according to one embodiment of the disclosure.

FIG. 1 shows a system 1 for automatic signal measurement according to one embodiment of the disclosure. The system 1 includes a device under test (DUT) 10, a control circuit 20, a data processing circuit 30, and a display device 40. The device under test 10 includes a test pad area 110. The test pad area 110 has multiple exposed test pads 120 coupled to multiple circuit nodes in the device under test 10. The control circuit 20 includes a memory 210. The control circuit 20 is coupled to the exposed test pads 120 through a clamping fixture 50. The control circuit 20 is configured to receive multiple test signals from the exposed test pads 120, store multiple test signals in the memory 210, and control a power on/off operation applied to the DUT 10 through the exposed test pads 120. The data processing circuit 30 is coupled to the control circuit 20. The data processing circuit 30 is configured to receive the test signals stored in the memory 210, and determine whether the test signals meet a set of predetermined criteria to generate a verification result. The display device 40 is driven by the data processing circuit 30 for displaying a signal waveform of the test signals and the verification result.

One example of DUT 10 is illustrated in FIG. 2, which shows the test pad area 110 in the DUT 10 according to one embodiment of the disclosure. The DUT 10 is, for example, a motherboard to be tested. The purpose of the test pad area 110 having multiple exposed test pads 120 is to achieve fast and automatic testing. In one embodiment, the test pad area 110 and the DUT 10 are disposed on the same circuit board. As shown in FIG. 2, the DUT 10 may include a printed circuit board 101, a circuit under test (CUT) 102 disposed on the printed circuit board 101, and a test pad area 110 on the printed circuit board 101. In this example the test pad area 110 is placed near an edge of the printed circuit board 101. However, the location of the test pad area 110 on the printed circuit board 101 is not limited to a particular location. The CUT 102 is, for example, a microprocessor, a microcontroller, a digital signal processor, etc.

The exposed test pads 120 in the test pad area 110 are made of metal, and are coupled to multiple circuit nodes in the CUT 102, such that the signal may be transmitted between the CUT 102 and the exposed test pads 120. As shown in FIG. 2, several exposed test pads 120 may be closely spaced. In one embodiment, the test pad area 110 has at least twenty exposed test pads 120, such that at least twenty signals from the CUT 102 can be measured simultaneously. The length L of the test pad area 110 is less than 20 mm, and the width W of the test pad area 110 is less than 3 mm. In an implementation example, the test pad area 110 has thirty exposed test pads, and the length L of the test pad area 110 is about 15 mm, the width W of the test pad area 110 is about 2 mm. In one embodiment, the DUT 10 may have more than one test pad area 110 on the printed circuit board 101. For example, two test pad areas 110 (each having thirty exposed test pads) may be used to measure up to sixty signals in the CUT 102.

The circuit nodes in the CUT 102 are coupled to the exposed test pads 120 due to the test pad area 110, and such coupling may cause interference that affects the normal behavior of the DUT 10. In one embodiment, the DUT 10 further includes an isolation component coupled between at least one of the circuit nodes and at least one of the exposed test pads 120. For example, among thirty exposed test pads, twelve test pads are connected to the respective circuit node through an isolation component. The isolation component effectively prevents interference caused by coupling between the circuit node and the exposed test pads 120.

Figure 3:
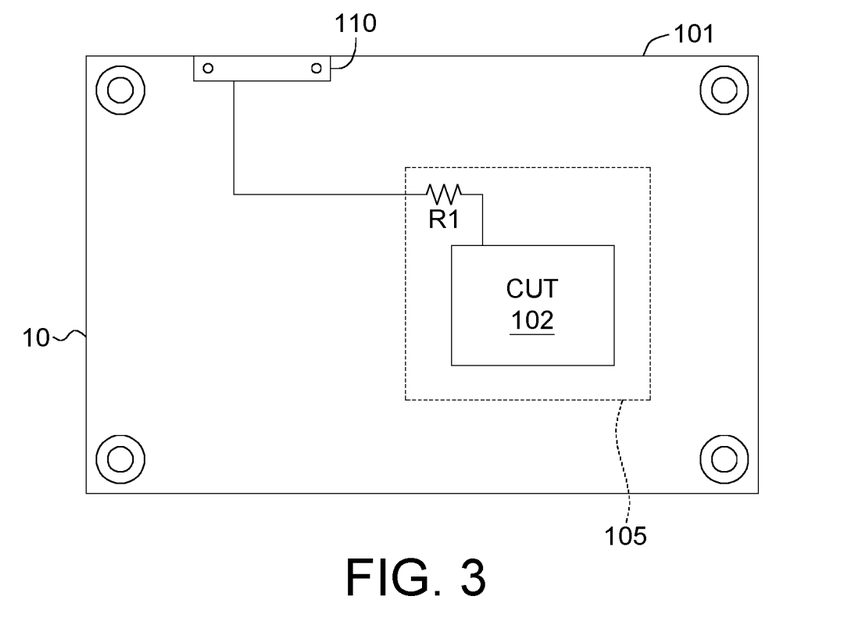
FIG. 3 shows the placement of an isolation component in the device under test according to one embodiment of the disclosure.

In one embodiment, the isolation component is a resistor. For example, a resistor having resistance 1KΩ may be used. Note that other circuit elements may also be applicable for the isolation component, using the resistor as the isolation component is merely exemplary rather than limiting. In one embodiment, the isolation component is disposed in a core area of the circuit board 101, which may be an area containing the circuit under test 102. FIG. 3 shows the placement of an isolation component in the device under test according to one embodiment of the disclosure. In the embodiment shown in FIG. 3, the resistor R1 is the isolation component coupled between the test pad area 110 and the circuit under test 102, and the resistor R1 is disposed in the core area 105 of the circuit board 101.

Figure 4A:
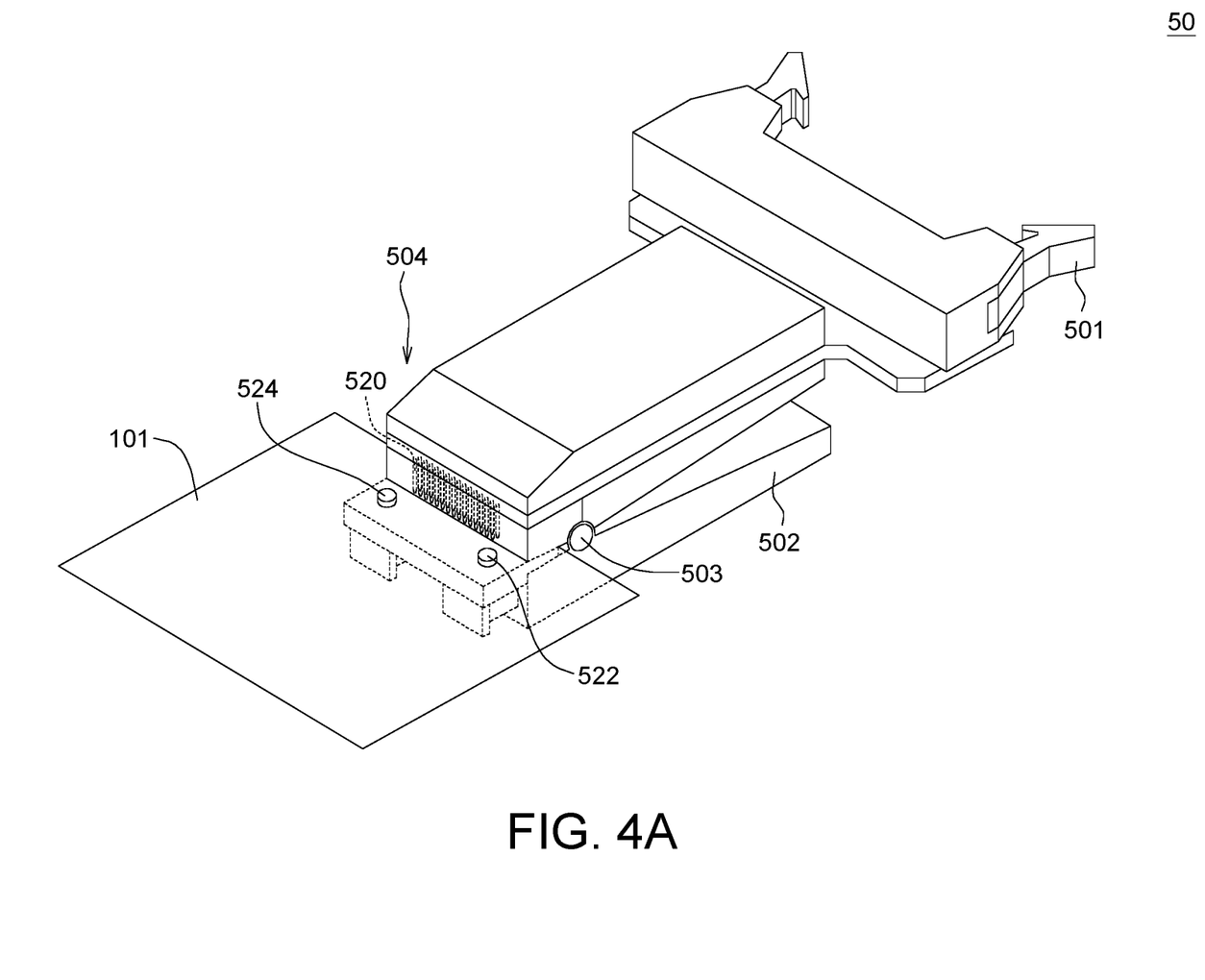
FIG. 4A shows a clamping fixture operating in the closed position according to one embodiment of the disclosure.
Figure 4B:
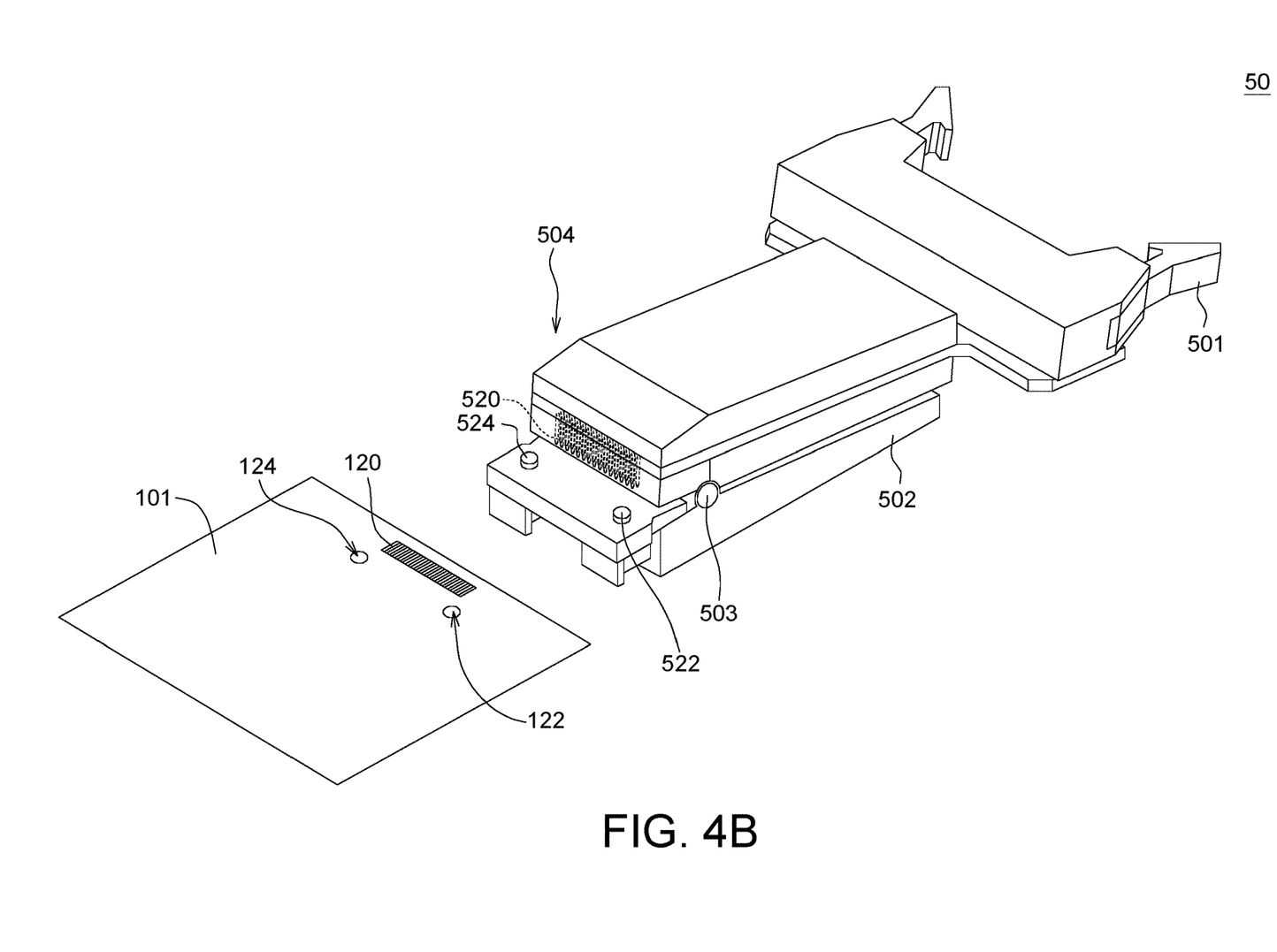
FIG. 4B shows the clamping fixture in FIG. 4A operating in the open position.
Figure 4C:
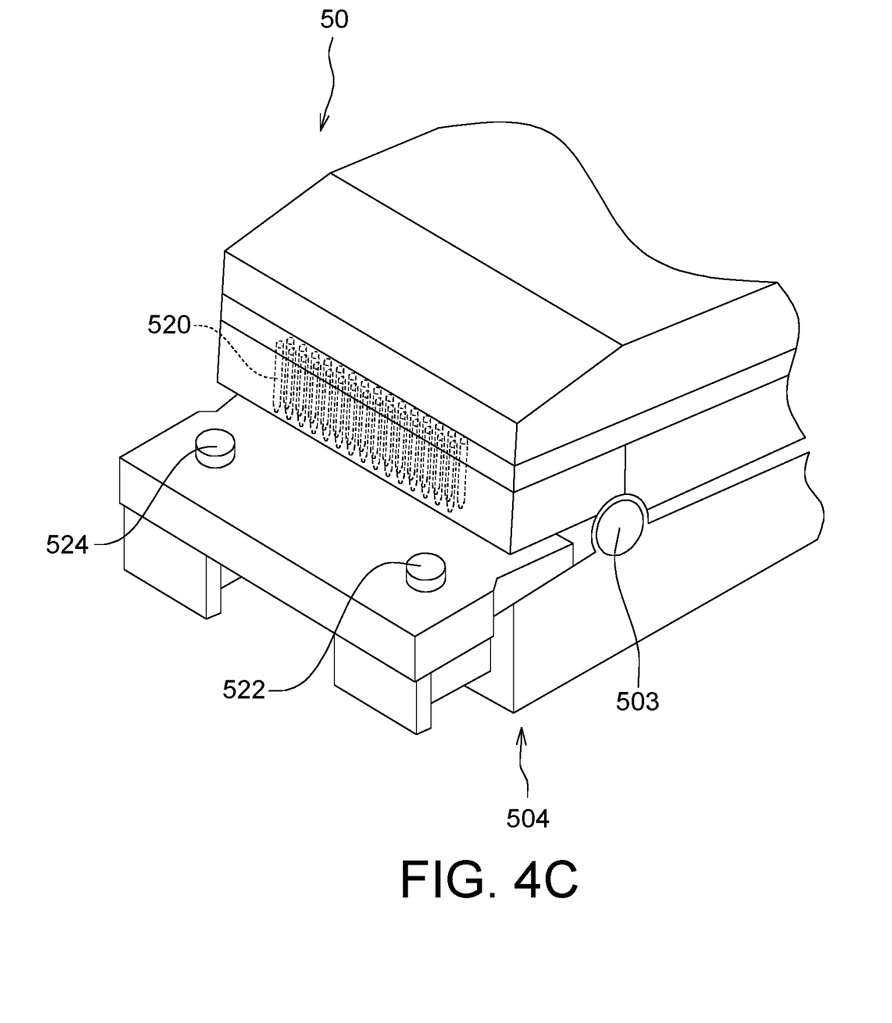
FIG. 4C shows the enlarged view of part of the clamping fixture in FIG. 4B operating in the open position.

The exposed test pads 120 are configured for conductive connection to an external circuit (such as the control circuit 20 shown in FIG. 1) through the clamping fixture 50. FIG. 4A shows a clamping fixture operating in a closed position according to one embodiment of the disclosure. FIG. 4B shows the clamping fixture in FIG. 4A operating in an open position. FIG. 4C shows the enlarged view of part of the clamping fixture in FIG. 4B operating in the open position. The clamping fixture 50 includes a connector 501, a clamping arm 502, a pivot 503, and a clamping portion 504. The connector 501 is connected to the control circuit 20. The clamping portion 504 is operable between the open position and the closed position due to the clamping arm 502 and the pivot 503. For example, when the clamping arm 502 is pressed, the clamping portion 504 is open and can be attached to the exposed test pads 120. As shown in FIG. 4B, there are multiple contact pins 520 inside the clamping portion 504 configured for conductive connection to the exposed test pads 120 in the test pad area 110. For example, there exists a one-to-one relationship between the contact pins 520 and the exposed test pads 120. Besides, as shown in FIG. 2 and FIG. 4B, the cylinder 522 and 524 can pass through the holes 122 and 124 such that the printed circuit board 101 is put in correct position and the contact pins 520 are electrically connected with the exposed test pads 120 in the test pad area 110 when the clamping portion 504 is operable in the closed position. Since the DUT 10 and the control circuit 20 are connected via the clamping fixture 50, a test engineer can quickly attach or detach the DUT 10, making it easy to test multiple circuit boards. Note that the clamping fixture 50 shown in FIGS. 4A to 4C is exemplary. The shape and the structure of the clamping fixture 50 are not limited thereto.

Figure 5:
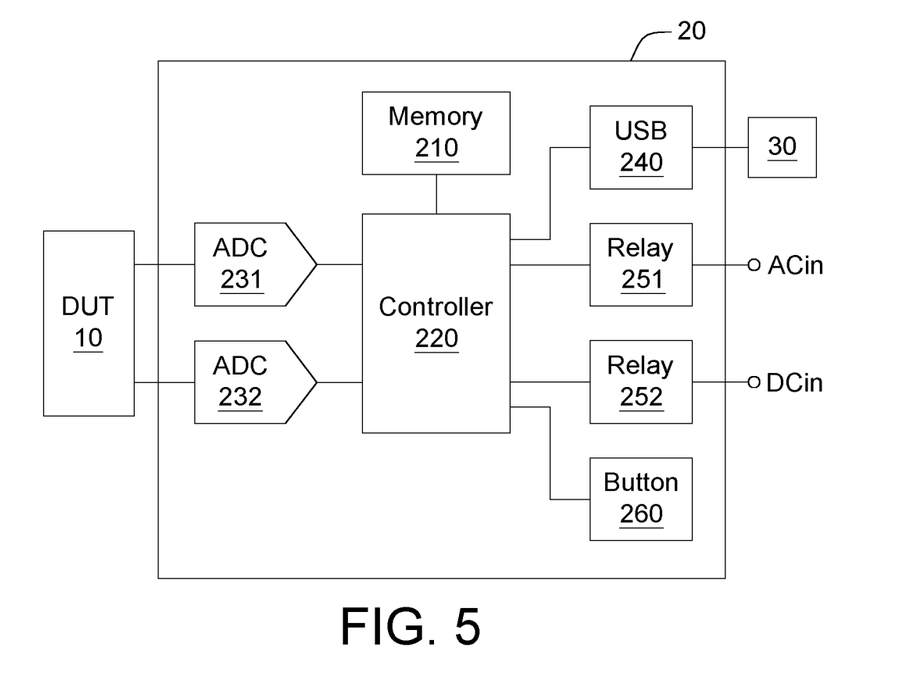
FIG. 5 shows a block diagram of the control circuit according to one embodiment of the disclosure.

The main function of the control circuit 20 is signal acquisition (ACQ). FIG. 5 shows a block diagram of the control circuit according to one embodiment of the disclosure. In this embodiment, the control circuit 20 includes a memory 210, a controller 220, analog-to-digital converters (ADC) 231 and 232, a universal serial bus (USB) interface circuit 240, a first relay 251, a second relay 252, and a power button 260. The memory 210 may be a random access memory (RAM), such as dynamic random access memory (DRAM). The controller 220 may be a microprocessor, a microcontroller, a digital logic circuit, a field programmable gate array (FPGA), and the like.

The ADC 231 converts the test signals received from the exposed test pads 120 to multiple digital sampled values to be stored in the memory 210. For example, the ADC 231 is an 8-channel ADC with sampling rate 40 MSPS, and thus the ADC 231 is able to capture eight test signals from eight exposed test pads 120. The ADC 231 may use low-voltage differential signaling (LVDS) output to communicate with the controller 220 (which may be FPGA). The converted digital output from the ADC 231 is stored in the memory 210 for further data processing. The control circuit 20 shown in FIG. 5 includes two ADCs, however, the invention is not limited thereto. For example, the control circuit 20 may include six ADCs (each having eight channels) to capture up to 48 test signals from the DUT 10.

The first relay 251 may be coupled to an alternating current (AC) power supply, such as the mains electricity supply. The control circuit 20 is configured to control the first relay 251 to control the power on/off operation applied to the DUT 10 through the exposed test pads 120. The second relay 252 may be coupled to a direct current (DC) power supply, which may be converted from the AC power supply by a power adapter. The control circuit 20 is configured to control the second relay 252 to control the power on/off operation applied to the DUT 10 through the exposed test pads 120. The control circuit 20 in this embodiment supports AC relay power mode and DC relay power mode. The power on/off operation applied to the DUT 10 includes, but not limited to, G3 (mechanical off) to S0 (working state) power on operation, and S0 to G3 power off operation.

The controller 220 may also be connected to one or more power buttons 260. The control circuit 20 is controlled by the power button 260 to control the power on/off operation applied to the DUT 10 through the exposed test pads 120. The corresponding power on/off operation applied to the DUT 10 includes, but not limited to, S4 (hibernate) to S0 power on operation, and S0 to S4 power off operation.

With the USB interface circuit 240, the control circuit 20 may be coupled to the data processing circuit 30 through the USB interface, such as USB 3.0. The main function of the data processing circuit 30 is calculation and display driving. The data processing circuit 30 may be a motherboard equipped with a central processing unit (CPU) for performing versatile tasks. The data processing circuit 30 may read data stored in the memory 210 to obtain information related to the test signals, such as the voltage level of each test signal at different timestamps. Based on the data read from the memory 210, the data processing circuit 30 may plot a signal waveform for each test signal and display the waveform on the display device 40. The display device 40 is for example a liquid crystal display (LCD) panel.

In addition, the data processing circuit 30 is configured to determine whether the test signals meet a set of predetermined criteria to generate a verification result. The set of predetermined criteria is corresponding to a power sequence of the device under test 10. For example, the set of predetermined criteria may be corresponding to certain requirements defined in industrial standards related to the power sequence. The set of predetermined criteria defines signal characteristics including at least one of timing, voltage level, slew rate, frequency, and monotonicity. For example, the set of predetermined criteria includes requirements for minimum or maximum interval between certain signal events, the minimum slew rate for a particular signal, minimum frequency, and signal monotonicity. Since the set of predetermined criteria is pre-built in the data processing circuit 30, the verification result can be generated automatically, and thus the test engineer does not have to manually check test signals one by one.

In one embodiment, the verification result shows a measured value (e.g. the voltage level or the interval length), a pass condition (e.g. required minimum interval), and a determination result (e.g. pass, fail, or warning) corresponding to each rule in the set of predetermined criteria. Table 1 below illustrates an exemplary simplified verification result generated by the data processing circuit 30. Each column (except the leftmost column) represents a rule to be checked. The row "label" refers to the name of the respective rule, "check type" may be interval (such as time duration between two concerned events) or monotone (checking whether the signal is increasing or decreasing monotonically), "begin channel" refers to the first concerned event, "end channel" refers to the second concerned event, "benchmark" refers to the pass condition, "result" shows the determination result according to the pass condition and the measured value.

TABLE 1

| Label | t2 | m4 | s1 |
|---|---|---|---|
| Check Type | Interval | Monotone | Interval |
| Begin channel | 3V3SB(10%) | 3V3 | 5VSB(90%) |
| Time (ms) | 20.0180 | 201.4384 | 17.2552 |
| End Channel | 1V8SB(10%) |  | 5V(90%) |
| Time (ms) | 31.6234 | 205.6753 | 198.5769 |
| Measured value (ms) | 11.6054 |  | 181.3S2170 |
| Benchmark | ≥0.0000 | ≥ | ≥0.0000S |
| Result | Pass | Pass | Pass |

The display device 40 may also displays a user interface 410 to receive input parameters from the user. The data processing circuit 30 is configured to receive a user setting via the user interface 410. The user setting may include at least one of a data acquisition sampling rate, a measurement time period, a data acquisition delay, a type of power on/off operation, and criteria to be used. For example, the criteria may be read from an input file or stored in a storage space (e.g. hard disk, flash memory). In one embodiment, several sets of predetermined criteria may be pre-stored, and one of which may be selected according to the user setting.

Figure 6:
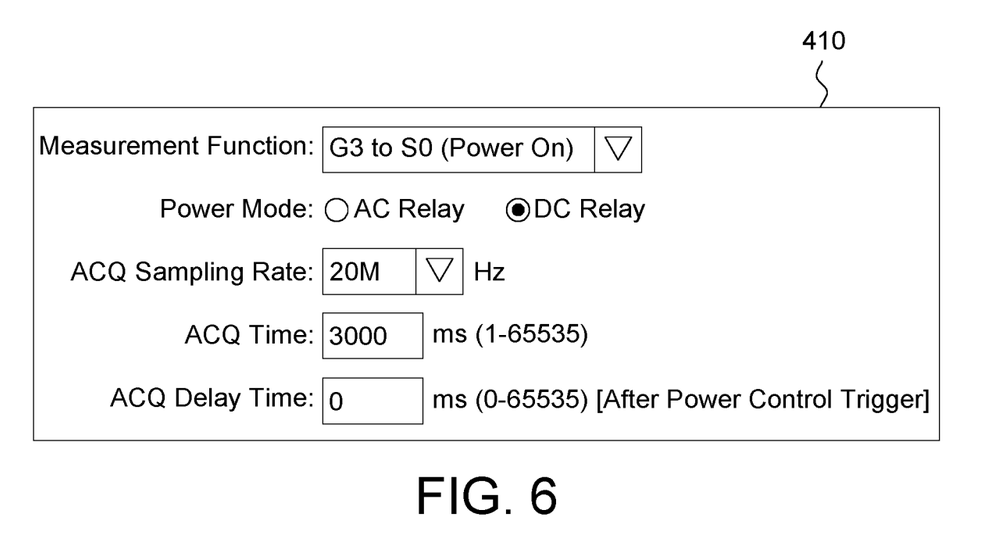
FIG. 6 shows a user interface displayed on the display device according to one embodiment of the disclosure.

FIG. 6 shows a user interface 410 displayed on the display device according to one embodiment of the disclosure. In this embodiment, the measurement function is corresponding to the type of power on/off operation, which involves a selection between a power on operation from G3 state to S0 state and a power off operation from S0 state to G3 state. The power mode involves a selection between an AC relay mode and a DC relay mode. The ACQ sampling rate represents the data acquisition sampling rate of the ADC 231 and 232 shown in FIG. 5. The ACQ sampling rate may be set according to the sampling rate, the number of channels, the resolution of the ADC 231, and the storage size of the memory 210. The ACQ time refers to the length of the measurement time period. The ACQ delay time refers to the time delay between the power on operation applied to the DUT 10 and the starting signal capture time of the control circuit 20. The user interface 410 shown in FIG. 6 is exemplary rather than limiting. Available options shown on the user interface 410 may be designed based on the applications.

According to an embodiment of the disclosure, a system for automatic signal measurement of a device under test is provided. The device under test includes a test pad area having a number of exposed test pads coupled to a number of circuit nodes in the device under test. The system includes a control circuit, a data processing circuit, and a display device. The control circuit includes a memory. The control circuit is coupled to the exposed test pads through a clamping fixture. The control circuit is configured to receive a number of test signals from the exposed test pads, store the test signals in the memory, and control a power on/off operation applied to the device under test through the exposed test pads. The data processing circuit is coupled to the control circuit. The data processing circuit is configured to receive the test signals stored in the memory, and determine whether the test signals meet a set of predetermined criteria to generate a verification result. The display device is driven by the data processing circuit, for displaying a signal waveform of the test signals and the verification result.

According to the embodiments given in this disclosure, a device adaptable for automatic signal measurement is provided. The proposed device has a test pad area including exposed test pads, which may be connected to an external circuit through a clamping fixture. By introducing the test pad area in the device, the external circuit for automatic signal measurement can be connected easily and quickly. In addition, a large number of signals can be measured simultaneously with the test pad area. A system for automatic signal measurement is also provided. Because the system has a set of predetermined criteria, the system can automatically determine whether the test signals pass the criteria, and can also display the signal waveform and the verification result on a display device. The test engineer does not need to trace every signal in detail for debugging purpose. Instead, the test engineer can examine the verification result and quickly find out where the problem is.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A system for automatic signal measurement, the system comprising:
   a device under test, comprising a test pad area, wherein the test pad area has a plurality of exposed test pads coupled to a plurality of circuit nodes in the device under test;
   a control circuit, comprising a memory, wherein the control circuit is coupled to the exposed test pads through a clamping fixture, the control circuit is configured to receive a plurality of test signals from the exposed test pads, store the plurality of test signals in the memory, and control a power on/off operation applied to the device under test through the exposed test pads;
   a data processing circuit coupled to the control circuit, wherein the data processing circuit is configured to receive the plurality of test signals stored in the memory, and determine whether the plurality of test signals meet a set of predetermined criteria to generate a verification result; and
   a display device driven by the data processing circuit, for displaying a signal waveform of the plurality of test signals, the verification result, and a user interface;
   wherein the data processing circuit is configured to receive a user setting via the user interface, where the user setting comprises at least one of a data acquisition sampling rate, a measurement time period, a data acquisition delay, a type of power on/off operation, and criteria to be used.

2. The system for automatic signal measurement according to claim 1, wherein the test pad area and the device under test are disposed on a same circuit board.

3. The system for automatic signal measurement according to claim 2, wherein the test pad area has at least 20 exposed test pads, and a length of the test pad area is less than 20 mm, a width of the test pad area is less than 3 mm.

4. The system for automatic signal measurement according to claim 2, wherein the device under test further comprises an isolation component coupled between one of the plurality of circuit nodes and one of the plurality of exposed test pads.

5. The system for automatic signal measurement according to claim 4, wherein the isolation component is a resistor.

6. The system for automatic signal measurement according to claim 4, wherein the isolation component is disposed in a core area of the circuit board.

7. The system for automatic signal measurement according to claim 1, wherein the control circuit further comprises an analog-to-digital converter, for converting the plurality of test signals received from the exposed test pads to a plurality of digital sampled values to be stored in the memory.

8. The system for automatic signal measurement according to claim 1, wherein the control circuit further comprises a first relay coupled to an AC power supply, and the control circuit is configured to control the first relay to control the power on/off operation applied to the device under test through the exposed test pads.

9. The system for automatic signal measurement according to claim 1, wherein the control circuit further comprises a second relay coupled to a DC power supply, and the control circuit is configured to control the second relay to control the power on/off operation applied to the device under test through the exposed test pads.

10. The system for automatic signal measurement according to claim 1, wherein the control circuit is controlled by a power button to control the power on/off operation applied to the device under test through the exposed test pads.

11. The system for automatic signal measurement according to claim 1, wherein the set of predetermined criteria is corresponding to a power sequence of the device under test, and the set of predetermined criteria defines signal characteristics comprising at least one of timing, voltage level, slew rate, frequency, and monotonicity.

12. The system for automatic signal measurement according to claim 1, wherein the verification result shows a measured value, a pass condition, and a determination result corresponding to each rule in the set of predetermined criteria.

13. The system for automatic signal measurement according to claim 1, wherein the data processing circuit is coupled to the control circuit through a USB interface.

14. The system for automatic signal measurement according to claim 1, wherein the type of power on/off operation comprises at least a first selection between an AC relay mode and a DC relay mode, and a second selection between a power on operation from G3 state to S0 state and a power off operation from S0 state to G3 state.

15. A device adaptable for automatic signal measurement, the device comprising:
   a printed circuit board;
   a circuit under test disposed on the printed circuit board; and
   a test pad area on the printed circuit board, wherein the test pad area has a plurality of exposed test pads coupled to a plurality of circuit nodes in the circuit under test, the exposed test pads are configured for conductive connection to an external circuit through a clamping fixture;
   wherein the external circuit is a control circuit, the control circuit coupled to a data processing circuit, a display device is driven by the data processing circuit; and
   wherein the display device displays a user interface, the data processing circuit is configured to receive a user setting via the user interface, where the user setting comprises at least one of a data acquisition sampling rate, a measurement time period, a data acquisition delay, a type of power on/off operation, and criteria to be used.

16. The device adaptable for automatic signal measurement according to claim 15, wherein the test pad area has at least 20 exposed test pads, and a length of the test pad area is less than 20 mm, a width of the test pad area is less than 3 mm.

17. The device adaptable for automatic signal measurement according to claim 15, further comprising an isolation component coupled between one of the plurality of circuit nodes and one of the plurality of exposed test pads.

18. The device adaptable for automatic signal measurement according to claim 17, wherein the isolation component is a resistor.

19. The device adaptable for automatic signal measurement according to claim 17, wherein the isolation component is disposed in a core area of the printed circuit board.

20. A system for automatic signal measurement of a device under test, the device under test including a test pad area having a plurality of exposed test pads coupled to a plurality of circuit nodes in the device under test, the system comprising:

a control circuit, comprising a memory, wherein the control circuit is coupled to the exposed test pads through a clamping fixture, the control circuit is configured to receive a plurality of test signals from the exposed test pads, store the plurality of test signals in the memory, and control a power on/off operation applied to the device under test through the exposed test pads;

a data processing circuit coupled to the control circuit, wherein the data processing circuit is configured to receive the plurality of test signals stored in the memory, and determine whether the plurality of test signals meet a set of predetermined criteria to generate a verification result; and a display device driven by the data processing circuit, for displaying a signal waveform of the plurality of test signals, the verification result, and a user interface;

wherein the data processing circuit is configured to receive a user setting via the user interface, where the user setting comprises at least one of a data acquisition sampling rate, a measurement time period, a data acquisition delay, a type of power on/off operation, and criteria to be used.

\* \* \* \* \*